US012394751B2

(12) United States Patent
Wang et al.

(10) Patent No.: US 12,394,751 B2
(45) Date of Patent: Aug. 19, 2025

(54) METHOD OF FORMING SEMICONDUCTOR STRUCTURE

(71) Applicant: Yangtze Memory Technologies Co., Ltd., Wuhan (CN)

(72) Inventors: Xinsheng Wang, Wuhan (CN); Li Zhang, Wuhan (CN); Gaosheng Zhang, Wuhan (CN); Xianjin Wan, Wuhan (CN); Ziqun Hua, Wuhan (CN); Jiawen Wang, Wuhan (CN); Taotao Ding, Wuhan (CN); Hongbin Zhu, Wuhan (CN); Weihua Cheng, Wuhan (CN); Shining Yang, Wuhan (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 784 days.

(21) Appl. No.: 17/488,325

(22) Filed: Sep. 29, 2021

(65) Prior Publication Data
US 2022/0020725 A1 Jan. 20, 2022

Related U.S. Application Data

(60) Division of application No. 16/378,568, filed on Apr. 9, 2019, now abandoned, which is a continuation of
(Continued)

(51) Int. Cl.
*H01L 23/00* (2006.01)
(52) U.S. Cl.
CPC .............. *H01L 24/83* (2013.01); *H01L 24/08* (2013.01); *H01L 24/09* (2013.01); *H01L 24/27* (2013.01);
(Continued)

(58) Field of Classification Search
CPC ......... H01L 24/26–33; H01L 2224/26–33519; H01L 2224/08145; H01L 2224/08148; H01L 2224/73104; H01L 2224/73204
See application file for complete search history.

(56) References Cited

U.S. PATENT DOCUMENTS 6,350,670 B1 * 2/2002 Andideh .......... H01L 21/02274
438/618
10,283,493 B1 5/2019 Nishida
(Continued)

FOREIGN PATENT DOCUMENTS

CN 106233453 A 12/2016
JP WO2017/115832 A1 7/2017
(Continued)

OTHER PUBLICATIONS

Chen, the specification, including the claims, and drawings in the U.S. Appl. No. 16/378,517, filed Apr. 8, 2019.
(Continued)

*Primary Examiner* — Dale E Page
*Assistant Examiner* — Abbigale A Boyle
(74) *Attorney, Agent, or Firm* — HANLEY, FLIGHT & ZIMMERMAN, LLC

(57) ABSTRACT

The present invention relates to a semiconductor structure and a manufacturing method thereof. The semiconductor structure includes a first substrate, and a bonding layer located on a surface of the first substrate. The material of the first bonding layer is a dielectric material containing element carbon (C). C atomic concentration of a surface layer of the first bonding layer away from the first substrate is higher than or equal to 35%. The first bonding layer of the semiconductor structure may be used to enhance bonding strength during bonding.

19 Claims, 3 Drawing Sheets

Related U.S. Application Data application No. PCT/CN2018/093690, filed on Jun. 29, 2018.

(52) U.S. Cl.
CPC .... *H01L 24/33* (2013.01); *H01L 2224/08145* (2013.01); *H01L 2224/27452* (2013.01); *H01L 2224/29023* (2013.01); *H01L 2224/29186* (2013.01); *H01L 2224/29686* (2013.01); *H01L 2224/32145* (2013.01); *H01L 2224/335* (2013.01)

(56) References Cited

U.S. PATENT DOCUMENTS

| | | |
|---|---|---|
| 10,811,380 B2 | 10/2020 | Wang et al. |
| 10,818,631 B2 | 10/2020 | Wang et al. |
| 2004/0195659 A1 | 10/2004 | Grill |
| 2004/0227247 A1 | 11/2004 | Chooi et al. |
| 2005/0260411 A1 | 11/2005 | Ravi |
| 2011/0128399 A1 | 6/2011 | Fujii |
| 2011/0147882 A1 | 6/2011 | Tsutsue |
| 2014/0235031 A1 | 8/2014 | Herbots |
| 2015/0255556 A1 | 9/2015 | Cheng |
| 2016/0197049 A1 | 7/2016 | Chen |
| 2019/0002284 A1 | 1/2019 | Inoue |
| 2019/0096830 A1* | 3/2019 | Wei .................. H01L 24/92 |
| 2020/0006275 A1 | 1/2020 | Chen et al. |
| 2020/0006284 A1 | 1/2020 | Chen et al. |

FOREIGN PATENT DOCUMENTS

| | | |
|---|---|---|
| TW | 200539937 | 12/2005 |
| TW | 201806075 A | 2/2018 |
| WO | 2013/066977 A1 | 5/2013 |
| WO | 2017115832 A1 | 7/2017 |

OTHER PUBLICATIONS

Chen, the specification, including the claims, and drawings in the U.S. Appl. No. 16/378,518, filed Apr. 8, 2019.

Wang, the specification, including the claims, and drawings in the U.S. Appl. No. 16/377,241, filed Apr. 7, 2019.

Wang, the specification, including the claims, and drawings in the U.S. Appl. No. 16/377,244, filed Apr. 7, 2019.

\* cited by examiner

METHOD OF FORMING SEMICONDUCTOR STRUCTURE

CROSS REFERENCE TO RELATED APPLICATIONS

This application is a division of application Ser. No. 16/378,568 filed on Apr. 9, 2019, which is a continuation of International Application No. PCT/CN2018/093690 filed Jun. 29, 2018 and incorporated by reference herein in its entirety.

BACKGROUND OF THE INVENTION

1. Field of the Invention

The present invention relates to a field of semiconductor technology, and more particularly, to a semiconductor structure and a method of forming the same.

2. Description of the Prior Art

In the 3D wafer technology platform, two or more wafers having semiconductor devices formed thereon are usually bonded to one another by wafer bonding technology for enhancing the integration of the wafer. In the current wafer bonding technique, a bonding film is formed on a wafer bonding surface for bonding.

In the current technology, a silicon oxide film and a silicon nitride film are generally used as the bonding film. However, the bonding strength is not enough, defects are generated in the manufacturing process easily, and the production yield is affected.

Additionally, metal connection structures are formed in the bonding film. In the hybrid bonding process, the metal connection structures tend to diffuse at the bonding interface, and the product performance is affected accordingly.

Therefore, how to improve the quality of the wafer bonding is an urgent problem to be solved.

SUMMARY OF THE INVENTION

The technical problem to be solved in the present invention is providing a semiconductor structure and a method of forming the same.

A semiconductor structure is provided by the present invention. The semiconductor structure includes a first substrate; and a first bonding layer located on a surface of the first substrate. A material of the first bonding layer is a dielectric material containing element carbon (C), and C atomic concentration of a surface layer of the first bonding layer away from the first substrate is higher than or equal to 35%.

Selectively, C atomic concentration distributes uniformly in the first bonding layer.

Selectively, C atomic concentration in the first bonding layer distributes uniformly in the first bonding layer or increases gradually with increasing thickness of the first bonding layer.

Selectively, the thickness of the surface layer ranges from 20 angstroms (Å) to 50 angstroms.

Selectively, the semiconductor structure further includes a second substrate. A second bonding layer is formed on a surface of the second substrate, and the second bonding layer is bonded to and fixed on the first bonding layer with a surface of the second bonding layer facing a surface of the first bonding layer.

Selectively, a material of the second bonding layer is a dielectric material containing element C, and C atomic concentration of a surface layer of the second bonding layer away from the second substrate is higher than or equal to 35%.

Selectively, the material of the second bonding layer is identical to the material of the first bonding layer.

Selectively, the semiconductor structure further includes: a first bonding pad penetrating the first bonding layer; and a second bonding pad penetrating the second bonding layer. The first bonding pad and the second bonding pad are bonded to each other correspondingly.

A semiconductor structure is provided by the technical solution of the present invention. The semiconductor structure includes a first substrate; and a bonding stack layer located on a surface of the first substrate. The bonding stack layer includes bonding layers bonded to one another, and a material of the bonding stack layer is a dielectric material containing silicon (Si), nitrogen (N), carbon (C), and oxygen (O).

Selectively, the bonding stack layer is formed by oxidizing two bonding layers having $CH_3$ bonds and bonding the two bonding layers after the oxidizing.

Selectively, C atomic concentration of surface layers in the bonding layers adjacent to a bonding surface is higher than or equal to 35%.

Selectively, the semiconductor structure further includes a second substrate located on a side of the bonding stack layer away from the first substrate.

Selectively, the semiconductor structure further includes bonding pads penetrating the bonding layers. The bonding pads in two of the bonding layer are bonded to each other correspondingly.

A method of forming a semiconductor structure is further provided by the technical solution of the present invention. The method includes: providing a first substrate; forming a first bonding layer on a surface of the first substrate, wherein a material of the first bonding layer is a dielectric material containing element C and a $CH_3$ bond; providing a second substrate; forming a second bonding layer on a surface of the second substrate, wherein a material of the second bonding layer is a dielectric material containing element C and a $CH_3$ bond; oxidizing a surface layer of the first bonding layer and a surface layer of the second bonding layer, wherein the $CH_3$ bonds are oxidized to be OH bonds; and bonding the first bonding layer and the second bonding layer to each other correspondingly.

Selectively, C atomic concentration within the surface layer of the first bonding layer and C atomic concentration within the surface layer of the second bonding layer are higher than or equal to 35%.

Selectively, the first bonding layer is formed by a plasma-enhanced chemical vapor deposition (PECVD) process.

Selectively, C atomic concentration in the first bonding layer distributes uniformly in the first bonding layer or increases gradually with increasing thickness of the first bonding layer, and C atomic concentration in the second bonding layer distributes uniformly in the second bonding layer or increases gradually with increasing thickness of the second bonding layer.

Selectively, the thickness of the surface layer of the first bonding layer and the thickness of the surface layer of the second bonding layer range from 10 angstroms (Å) to 50 angstroms.

The first bonding layer of the semiconductor structure of the present invention may have higher bonding strength during the bonding process and may be used to block metal materials from diffusing at the bonding interface, and the performance of the semiconductor structure formed by the method of the present invention may be enhanced accordingly.

These and other objectives of the present invention will no doubt become obvious to those of ordinary skill in the art after reading the following detailed description of the preferred embodiment that is illustrated in the various figures and drawings.

DETAILED DESCRIPTION

Embodiments of semiconductor structures and methods of forming the same provided by the present invention are described in detail by the following contents and figures.

Please refer to FIGS. 1-4. FIGS. 1-4 are structural schematic drawings illustrating processes of forming a semiconductor structure according to an embodiment of the present invention.

Figure 1:
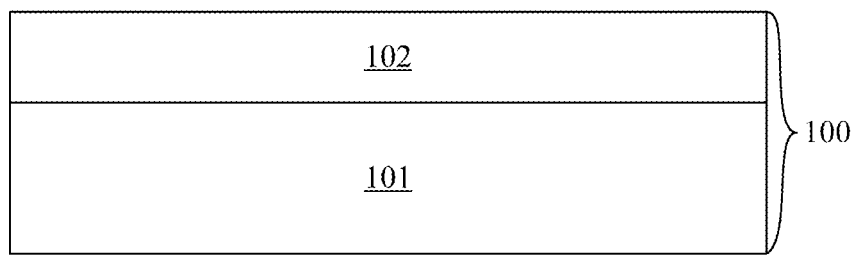
FIGS. 1-4 are structural schematic drawings illustrating processes of forming a semiconductor structure according to an embodiment of the present invention.

Please refer to FIG. 1, a first substrate 100 is provided. The first substrate 100 includes a first semiconductor substrate 101 and a first device layer 102 formed on a surface of the first semiconductor substrate 101.

The first semiconductor substrate 101 may be a single crystal silicon substrate, a germanium (Ge) substrate, a silicon germanium (SiGe) substrate, a silicon-on-insulator (SOI) substrate, a germanium-on-insulator (GOI) substrate, and so forth. Suitable types of the first semiconductor substrate 101 may be used in accordance with the actual requirements of the devices and are not limited to the above descriptions. In the embodiment, the first semiconductor substrate 101 is a single crystal silicon substrate.

The first device layer 102 includes a semiconductor device, a metal interconnection structure connected with the semiconductor device, and a medium layer covering the semiconductor device and the metal interconnection structure. The first device layer 102 may be a multiple layer structure or a single layer structure. In an embodiment, the first device layer 102 includes a medium layer and a 3D NAND structure formed in the medium layer.

Figure 2:
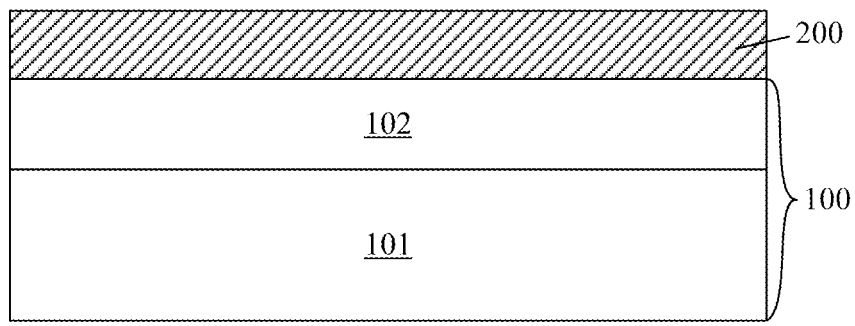

Please refer to FIG. 2. A first bonding layer 200 is formed on the surface of the first substrate 100. The material of the first bonding layer is a dielectric material containing element carbon (C). C atomic concentration of a surface layer having a certain thickness from the surface of the first bonding layer to the inside of the first bonding layer is higher than or equal to 35%.

The first bonding layer 200 may be formed by a chemical vapor deposition process. In the embodiment, the first bonding layer 200 is formed by a plasma-enhanced chemical vapor deposition process.

The material of the first bonding layer 200 is a dielectric material containing element C. In one embodiment, the first bonding layer 200 mainly includes silicon (Si), nitrogen (N), and carbon (C). In another embodiment, the first bonding layer 200 may be further doped with at least one element of Si, N, oxygen (O), hydrogen (H), phosphorus (P), or fluorine (F) in accordance with reactive gases used in the chemical vapor deposition process and requirements of specific products. The material of the first bonding layer 200 may be carbon-doped silicon nitride, carbon-doped silicon oxynitride, nitrogen-doped silicon oxycarbide, and so forth.

In one embodiment, the first bonding layer 200 is formed by a plasma-enhanced chemical vapor deposition process. A reactive gas used in the plasma-enhanced chemical vapor deposition process includes one of trimethylsilane or tetramethylsilane and includes $NH_3$. The flow ratio of trimethylsilane to $NH_3$ or the flow ratio of tetramethylsilane to $NH_3$ is 2:1, and the power is 800 W.

By controlling the process parameters of forming the first bonding layer 200, concentration of each composition in the first bonding layer 200 may be adjusted for modifying the adhesion between the first bonding layer 200 and the first device layer 102, the dielectric constant of the first bonding layer 200, and the bonding strength between the first bonding layer 200 and another bonding layer after bonding.

The element carbon in the first bonding layer 200 may be used to effectively enhance the bonding strength between the first bonding layer 200 and other bonding layers during the bonding process. The higher the C atomic concentration, the higher the bonding strength between the first bonding layer 200 and other bonding layers during the bonding process. The higher the C atomic concentration at the surface of the first bonding layer 200, the higher the bonding strength between the first bonding layer 200 and other bonding layers during the bonding process. The element carbon in the first bonding layer 200 may exist in the form of methyl group (—$CH_3$), the methyl group (—$CH_3$) may be oxidized to be hydroxyl group (—OH) after treatments, such as an oxidation treatment and a plasma activation treatment, performed before the bonding process, and the amount of hydroxyl increases accordingly. Finally in the bonding process, the amount of Si—O bonds at the bonding interface is increased for enhancing the bonding strength. Therefore, in the process of forming the first boding layer 200, the C atomic concentration of the surface layer of the first bonding layer 200 away from the first substrate is higher than or equal to 35% by adjusting the process parameters, and the surface of the first bonding layer 200 has a higher C atomic concentration accordingly. In one embodiment, the thickness of the surface layer may range from 10 angstroms (Å) to 50 angstroms. In another embodiment, the C atomic concentration of the surface layer having a thickness equal to 30 angstroms in the first bonding layer 200 is higher than 40%.

The adhesion between different material layers relates to the material compositions at two sides of the interface. The closer the material composition is, the higher the adhesion. For increasing the adhesion between the first bonding layer 200 and the first device layer 102, the process parameters may be adjusted gradually in the process of forming the first bonding layer 200 for forming composition having concentration varying gradually in the first bonding layer and making the material compositions at the two sides of the interface between the first bonding layer 200 and the first device layer 200 similar to each other. In one embodiment, the C atomic concentration in the first bonding layer 200 increases gradually with increasing thickness of the first bonding layer 200 by adjusting the process parameters of the deposition process as the thickness of the first bonding layer 200 increases in the process of forming the first bonding layer 200, and the C atomic concentration is highest at the surface of the first bonding layer 200. In another embodiment, the process parameters of the deposition process may be fixed during the process of forming the first bonding layer 200, and the concentration of each element in the first bonding layer 200 distributes uniformly at different thickness locations in the first bonding layer 200. For example, the C atomic concentration is consistent at each thickness location in the first bonding layer 200.

In another embodiment, the density of the first bonding layer 200 may change gradually with increasing thickness of the first bonding layer 200 by adjusting the parameters of the forming process. For example, the density of the first bonding layer 200 gradually increases, gradually decreases, or increases first and then decreases from the surface of the first device layer 102. The density of the first bonding layer 200 is close to the density of the first device layer 102 at the interface.

The first bonding layer 200 cannot be too thin for ensuring an enough bonding thickness of the first bonding layer 200 in the process of bonding the first bonding layer 200 to other bonding layers. In one embodiment, the thickness of the first bonding layer 200 is larger than 100 angstroms.

The first bonding layer 200 may include two or more sub bonding layers stacked with one another. The element compositions of different sub bonding layers may be different from one another. The composition concentration in each sub bonding layer may not vary with thickness or may change gradually with thickness. The composition concentration in the whole sub bonding layer may be adjusted for modifying the adhesion between the first bonding layer 200 and the first device layer 102, the adhesion at the interface between the sub bonding layers, and the dielectric constant of the first bonding layer 200.

Figure 3:
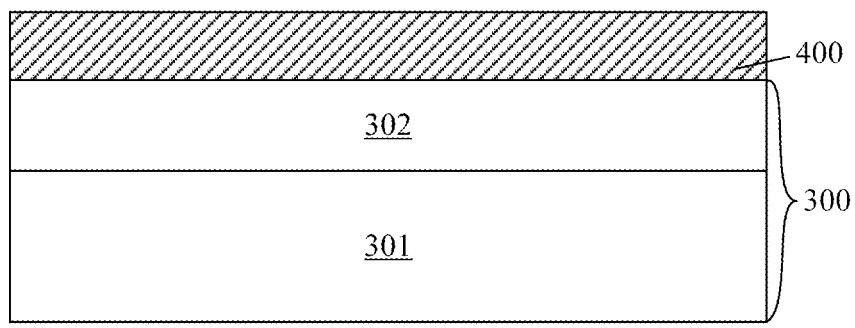

Please refer to FIG. 3. In another embodiment, the method further includes providing a second substrate 300 and forming a second bonding layer 400 on the surface of the second substrate 300.

The second substrate 300 includes a second semiconductor substrate 301 and a second device layer 302 located on the surface of the second semiconductor substrate 301.

The second bonding layer 400 is formed on the surface of the second device layer 302 by a chemical vapor deposition process. The material of the second bonding layer 400 may be silicon oxide or silicon nitride.

In the embodiment, the material of the second bonding layer 400 may be a dielectric material containing element carbon. In one embodiment, the second bonding layer 400 mainly includes Si, N, and C. In another embodiment, the second bonding layer 400 may be further doped with at least one element of Si, N, O, H, P, or F in accordance with reactive gases used in the chemical vapor deposition process and requirements of specific products. The second bonding layer may be formed by the same method of forming the first bonding layer 200. Please refer to the description about the first bonding layer 200 in the embodiments mentioned above, and that will not be redundantly described here. In one embodiment, the material of the second bonding layer 400 may be the same as the material of the first bonding layer 200 described above.

Figure 4:
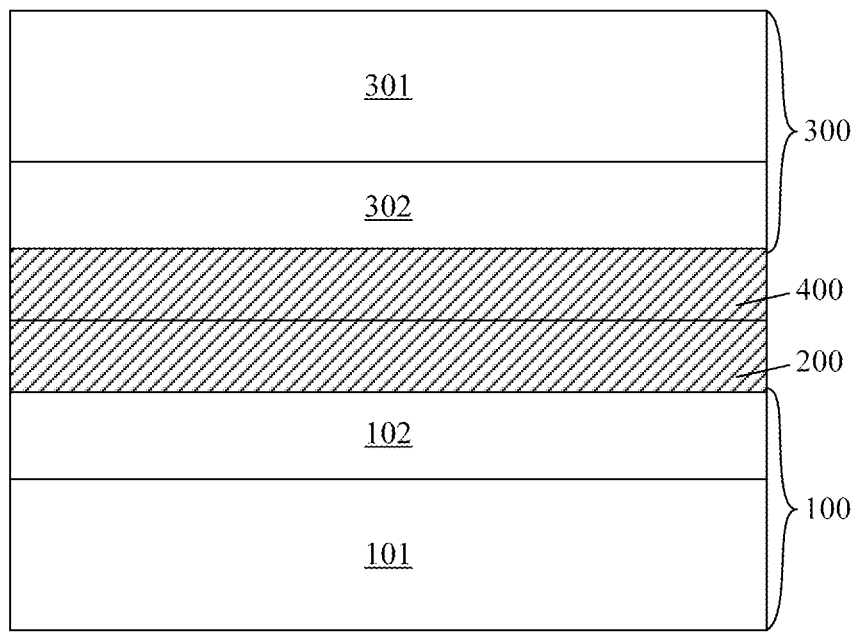

Please refer to FIG. 4. The second bonding layer 400 is bonded to and fixed on the first bonding layer 200 with a surface of the second bonding layer 400 facing a surface of the first bonding layer 200.

A part of the element carbon in the first bonding layer 200 and the second bonding layer 400 exists in the form of $CH_3$. The method further includes performing an oxidation treatment and a plasma treatment in sequence to the surface of the second bonding layer 400 and the surface of the first bonding layer 200 before the bonding process. The oxidation treatment can be used to oxidize —$CH_3$ or other carbon-containing groups in the second bonding layer 400 and the first bonding layer 200. The plasma treatment is used to activate chemical bonds on the surface of the first bonding layer 200 and the surface of the second bonding layer 400 for increasing the surface energy of the first bonding layer 200 and the second bonding layer 400. Finally, the —$CH_3$ or other carbon-containing groups are oxidized to be —OH. In one embodiment, oxygen is used as an oxidation gas, the temperature ranges from 25° C. to 80° C., and the treatment time ranges from 20 minutes to 200 minutes in the oxidation treatment. In one embodiment, $N_2$ is used as a plasma source gas, the power ranges from 75 W to 300 W, and the treatment time ranges from 15 seconds to 45 seconds in the plasma treatment.

The C atomic concentration is higher at the surface of the first bonding layer 200 and the surface of the second bonding layer 400, and the amount of hydroxyl formed by oxidation at the surfaces is larger. The hydroxyl and Si in the first bonding layer 200 and the second bonding layer 400 form silicon-oxide bonds in the bonding process for enhancing the bonding strength at the bonding interface. In one embodiment, the bonding strength between the second bonding layer 400 and the first bonding layer 200 is higher than 1.7 $J/M^2$. The bonding strength is generally lower than 1.5 $J/M^2$ by using carbon-free bonding layers in the conventional bonding technology.

In one embodiment, the first substrate 100 is a substrate having a 3D NAND memory structure formed therein, and the second substrate 200 is a substrate having a peripheral circuit formed therein.

In another embodiment, the above-mentioned bonding layer may be formed on two opposite surfaces of the substrate for realizing multiple layer bonding.

Figure 5:
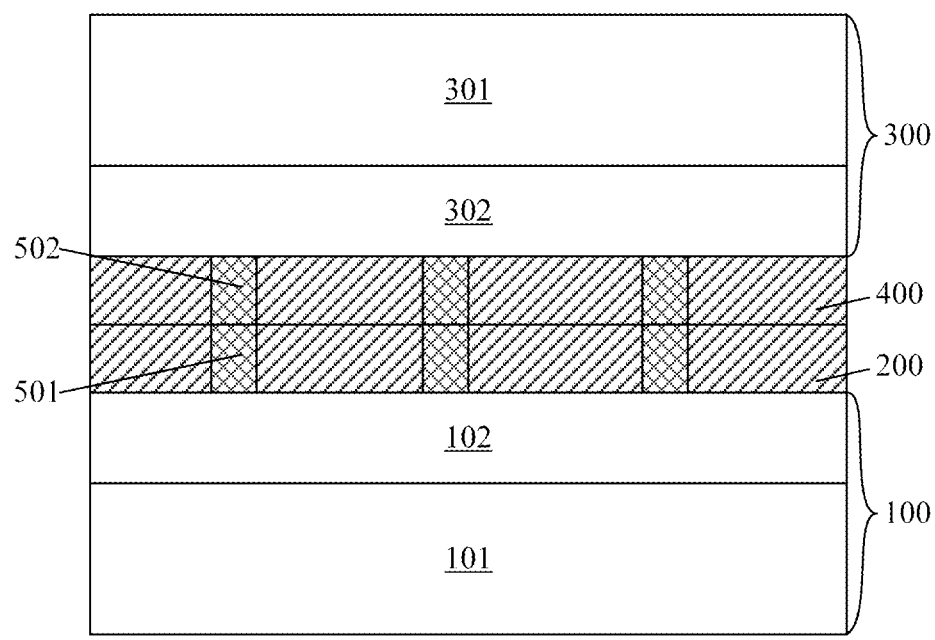
FIG. 5 is a schematic drawing illustrating a semiconductor structure according to an embodiment of the present invention.

Please refer to FIG. 5. In another embodiment, the method further includes forming a first bonding pad 501 penetrating the first bonding layer 200; forming a second bonding pad 502 penetrating the second bonding layer 400; and bonding the first bonding pad 501 to the second bonding pad 502 correspondingly as bonding the second bonding layer 400 to the first bonding layer 200 and fixing the second bonding layer 400 on the first bonding layer 200 with the surface of the second bonding layer 400 facing the surface of the first bonding layer 200.

The first bonding pad 501 and the second bonding pad 502 may be connected to the semiconductor devices and the metal interconnection layers in the first device layer 102 and the second device layer 302 respectively.

The method of forming the first bonding pad 501 may include patterning the first bonding layer 200; forming an opening penetrating the first bonding layer 200; filling the opening with metal material; and performing a planarization process for forming the first bonding pad 501 which the opening is filled with. The second bonding pad 502 is formed in the second bonding layer 400 by the same method. The first bonding pad 501 and the second bonding pad 502 are bonded to and connected with each other for realizing electrical connection between semiconductor devices in the first device layer 102 and the second device layer 302.

The material of the first bonding pad 501 and the second bonding pad 502 may be a metal material such as copper (Cu) or tungsten (W). The first bonding layer 200 and the second bonding layer 400 may both contain carbon for effectively blocking the materials of the first bonding pad 501 and the second bonding pad 502 from diffusing at the bonding interface, and the performance of the semiconductor structure is enhanced accordingly.

In the embodiment mentioned above, the first bonding layer is formed on the surface of the first substrate, and the material of the first bonding layer is a dielectric material containing element carbon for providing higher bonding strength at the bonding interface after the bonding process and blocking metal materials from diffusing at the bonding interface. The performance of the semiconductor structure formed by the method is enhanced accordingly.

The above-mentioned method is further applied in bonding a plurality of substrates.

Figure 6:
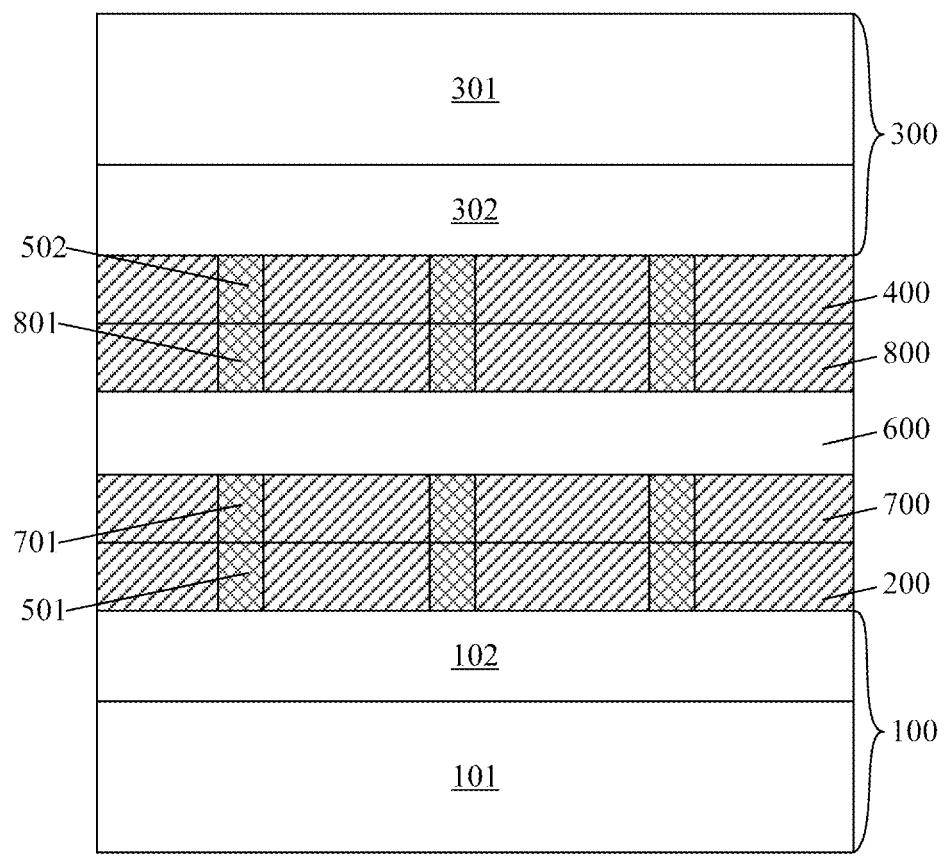
FIG. 6 is a schematic drawing illustrating a semiconductor structure according to an embodiment of the present invention.

Please refer to FIG. 6. In an embodiment of the present invention, the method further include providing a third substrate 600; forming a third bonding layer 700 and a fourth bonding layer 800 on two opposite surfaces of the third substrate 600 respectively; bonding the third bonding layer 700 to the first bonding layer 200 and fixing the third bonding layer 700 on the first bonding layer 200 with the surface of the third bonding layer 700 facing the surface of the first bonding layer 200; and bonding the fourth bonding layer 800 to the second bonding layer 400 and fixing the fourth bonding layer 800 on the second bonding layer 400 with the surface of the fourth bonding layer 800 facing the surface of the second bonding layer 400 for forming a tri-layer bonding structure.

Please refer to the material and the forming method of the first bonding layer 200 in the embodiments described above for the material and the forming method of the third bonding layer 700 and the fourth bonding layer 800, and those will not be redundantly described here.

In the embodiment, the method further includes forming a third bonding pad 701 in the third bonding layer 700; forming a fourth bonding pad 801 in the fourth bonding layer 800; bonding the third bonding pad 701 to the first bonding pad 501; and bonding the fourth bonding pad 801 to the second bonding pad 502.

In another embodiment, a bonding structure including four or more layers may be formed by the method described above.

It must be stated that, in the technical solution of the present invention, the types of the semiconductor devices in each substrate of the semiconductor structure are not limited to the given embodiments. Apart from 3D NAND, the semiconductor device may be a CMOS circuit, a CIS circuit, a TFT circuit, and so forth.

A semiconductor structure is further provided by embodiments of the present invention.

Please refer to FIG. 2. FIG. 2 is a structural schematic drawing illustrating a semiconductor structure according to an embodiment of the present invention.

The semiconductor structure includes a first substrate 100; and a first bonding layer 200 located on the surface of the first substrate 100. The material of the first bonding layer 200 is a dielectric material containing element carbon.

The first substrate 100 includes a first semiconductor substrate 101 and a first device layer 102 formed on the surface of the first semiconductor substrate 101.

The first semiconductor substrate 101 may be a single crystal silicon substrate, a Ge substrate, a SiGe substrate, a SOI substrate, a GOI substrate, and so forth. Suitable types of the first semiconductor substrate 101 may be used in accordance with the actual requirements of the devices and are not limited to the above descriptions. In the embodiment, the first semiconductor substrate 101 is a single crystal silicon substrate.

The first device layer 102 includes a semiconductor device, a metal interconnection structure connected with the semiconductor device, and a medium layer covering the semiconductor device and the metal interconnection structure. The first device layer 102 may be a multiple layer structure or a single layer structure. In an embodiment, the first device layer 102 includes a medium layer and a 3D NAND structure formed in the medium layer.

The material of the first bonding layer 200 is a dielectric material containing element C. In one embodiment, the first bonding layer 200 mainly includes Si, N, and C. In another embodiment, the first bonding layer 200 may be further doped with at least one element of Si, N, O, H, P, or F in accordance with the forming process and the requirements of the specific products. The material of the first bonding layer 200 may be carbon-doped silicon nitride, carbon-doped silicon oxynitride, nitrogen-doped silicon oxycarbide, and so forth.

By controlling the process parameters of forming the first bonding layer 200, the concentration of each composition in the first bonding layer 200 may be adjusted for modifying the adhesion between the first bonding layer 200 and the first device layer 102, the dielectric constant of the first bonding layer 200, and the bonding strength between the first bonding layer 200 and another bonding layer after bonding.

The element carbon in the first bonding layer 200 may be used to effectively enhance the bonding strength between the first bonding layer 200 and other bonding layers during the bonding process. The higher the C atomic concentration, the higher the bonding strength between the first bonding layer 200 and other bonding layers during the bonding process. The higher the C atomic concentration at the surface of the first bonding layer 200, the higher the bonding strength between the first bonding layer 200 and other bonding layers during the bonding process. The element carbon in the first bonding layer 200 may exist in the form of unstable methyl group (—CH$_3$), the methyl group (—CH$_3$) may be oxidized to be hydroxyl group (—OH) after treatments, such as a native oxidation and a plasma activation treatment, performed before the bonding process, and the amount of hydroxyl increases accordingly. Finally in the bonding process, the amount of Si—O bonds at the bonding interface is increased for enhancing the bonding strength.

The adhesion between different material layers relates to the material compositions at two sides of the interface. The closer the material composition is, the higher the adhesion. For further increasing the adhesion between the first bonding layer 200 and the first device layer 102, the composition concentration in the first bonding layer 200 may vary gradually with increasing thickness for making the material compositions at the two sides of the interface between the first bonding layer 200 and the first device layer 200 similar to each other. In one embodiment, the C atomic concentration in the first bonding layer 200 increases gradually with increasing thickness of the first bonding layer 200, and the C atomic concentration is highest at the surface of the first bonding layer 200. In another embodiment, the concentration of each element in the first bonding layer 200 distributes uniformly at different thickness locations in the first bonding layer 200. For example, the C atomic concentration is consistent at each thickness location in the first bonding layer 200.

In another embodiment, the density of the first bonding layer 200 changes gradually with increasing thickness. For example, the density of the first bonding layer 200 gradually increases, gradually decreases, or increases first and then decreases from the surface of the first device layer 102. The density of the first bonding layer 200 is close to the density of the first device layer 102 at the interface.

The first bonding layer 200 cannot be too thin for ensuring an enough bonding thickness of the first bonding layer 200 in the process of bonding the first bonding layer 200 to other bonding layers. In one embodiment, the thickness of the first bonding layer 200 is larger than 100 angstroms. For having enough C atomic concentration near the surface of the first bonding layer 200, in an embodiment, the C atomic concentration of the surface layer having a certain thickness from the surface of the first bonding layer 200 to the inside of the first bonding layer 200 is higher than or equal to 35%. The thickness of the surface layer may range from 10 angstroms to 50 angstroms. In one embodiment, the C atomic concentration within a thickness equal to 30 angstroms from the surface of the first bonding layer 200 to the inside of the first bonding layer 200 is higher than 40%.

The first bonding layer 200 may include two or more sub bonding layers stacked with one another. The element compositions of different sub bonding layers may be different from one another. The composition concentration in each sub bonding layer may not vary with thickness or may change gradually with thickness. The composition concentration in the whole sub bonding layer may be adjusted for modifying the adhesion between the first bonding layer 200 and the first device layer 102, the adhesion at the interface between the sub bonding layers, and the dielectric constant of the first bonding layer 200.

Please refer to FIG. 4. FIG. 4 is a structural schematic drawing illustrating a semiconductor structure according to an embodiment of the present invention.

In the embodiment, the semiconductor structure further includes a second substrate 300. A second bonding layer 400 is formed on the surface of the second substrate 300. The second bonding layer 400 is bonded to and fixed on the first bonding layer 200 with the surface of the second bonding layer 400 facing the surface of the first bonding layer 200.

The second substrate 300 includes a second semiconductor substrate 301 and a second device layer 302 located on the surface of the second semiconductor substrate 301. The material of the second bonding layer 400 may be silicon oxide or silicon nitride. The material of the second bonding layer 400 may be a dielectric material containing element C also. For details, please refer to the description of the first bonding layer 200 in the embodiments described above, and that will not be redundantly described here. In one embodiment, the material of the second bonding layer 400 is the same as the material of the first bonding layer 200 described above.

The second bonding layer 400 is bonded to and fixed on the first bonding layer 200 with the surface of the second bonding layer 400 facing the surface of the first bonding layer 200. The C atomic concentration is higher at the surface of the first bonding layer 200 and the surface of the second bonding layer 400. The amount of hydroxyl formed by oxidation at the surfaces is larger during the bonding process, and more silicon-oxide bonds are formed at the bonding interface for enhancing the bonding strength at the bonding interface.

In one embodiment, the first substrate 100 is a substrate having a 3D NAND memory structure formed therein, and the second substrate 200 is a substrate having a peripheral circuit formed therein.

In another embodiment, the semiconductor structure may include three or more substrates, and the adjacent substrates are bonded to one another by the bonding layers in the embodiments of the present invention.

Please refer to FIG. 5. FIG. 5 is a structural schematic drawing illustrating a semiconductor structure according to another embodiment of the present invention.

In the embodiment, the semiconductor structure further includes a first bonding pad 501 penetrating the first bonding layer 200 and a second bonding pad 502 penetrating the second bonding layer 400. The second bonding layer 400 is bonded to and fixed on the first bonding layer 200 with the surface of the second bonding layer 400 facing the surface of the first bonding layer 200, and the first bonding pad 501 is bonded to the second bonding pad 502 correspondingly.

The first bonding pad 501 and the second bonding pad 502 may be connected to the semiconductor devices and the metal interconnection layers in the first device layer 102 and the second device layer 302 respectively.

The material of the first bonding pad 501 and the second bonding pad 502 may be a metal material such as Cu or W. The first bonding layer 200 and the second bonding layer 400 may both contain carbon, and the C atomic concentration is higher at the bonding interface for effectively blocking the materials of the first bonding pad 501 and the second bonding pad 502 from diffusing at the bonding interface. The performance of the semiconductor structure is enhanced accordingly.

In one embodiment, the first substrate 100 is a substrate having a 3D NAND memory structure formed therein, and the second substrate 200 is a substrate having a peripheral circuit formed therein.

Please refer to FIG. 6. FIG. 6 is a schematic drawing illustrating a semiconductor structure according to another embodiment of the present invention.

In the embodiment, the semiconductor structure further includes a third substrate 600, a third bonding layer 700 located on a surface at one side of the third substrate 600, and a fourth bonding layer 800 located on an opposite surface at another side of the third substrate 600. The third bonding layer 700 is bonded to and fixed on the first bonding layer 200 with the surface of the third bonding layer 700 facing the surface of the first bonding layer 200, and the fourth bonding layer 800 is bonded to and fixed on the second bonding layer 400 with the surface of the fourth bonding layer 800 facing the surface of the second bonding layer 400 for forming a tri-layer bonding structure.

Please refer to the material and the structure of the first bonding layer 200 in the embodiments described above for the material and the structure of the third bonding layer 700 and the fourth bonding layer 800, and those will not be redundantly described here.

In the embodiment, the semiconductor structure further includes a third bonding pad 701 penetrating the third bonding layer 700 and a fourth bonding pad 801 penetrating the fourth bonding layer 800. The third bonding pad 701 is bonded to the first bonding pad 501, and the fourth bonding pad 801 is bonded to the second bonding pad 502.

In another embodiment, a bonding structure including four or more layers may be formed by the method described above.

The above descriptions are only preferred embodiments of the present invention, and it should be noted that those skilled in the art can also make several improvements and embellishments without departing from the principles of the present invention. These improvements and embellishments should also be regarded as the protection scope of the present invention.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method of forming a semiconductor structure, comprising:
    providing a first substrate;
    forming a first bonding layer on a surface of the first substrate, wherein a material of the first bonding layer is a dielectric material containing an element carbon (C) and a methyl (CH3) bond;
    providing a second substrate;
    forming a second bonding layer on a surface of the second substrate, wherein a material of the second bonding layer is a dielectric material containing the element C and the CH3 bond;
    oxidizing a surface layer of the first bonding layer and a surface layer of the second bonding layer via an oxidation treatment, wherein the CH3 bonds are oxidized to be hydroxyl (OH) bonds;
    performing a plasma treatment to the surface layer of the first bonding layer and the surface layer of the second bonding layer; and
    bonding the first bonding layer and the second bonding layer to each other correspondingly.

2. The method of forming the semiconductor structure according to claim 1, wherein a C atomic concentration within the surface layer of the first bonding layer and a C atomic concentration within the surface layer of the second bonding layer are higher than or equal to 35%.

3. The method of forming the semiconductor structure according to claim 1, wherein the first bonding layer is formed by a plasma-enhanced chemical vapor deposition process.

4. The method of forming the semiconductor structure according to claim 3, wherein a reactive gas used in the plasma-enhanced chemical vapor deposition process includes NH3 and one of trimethylsilane or tetramethylsilane.

5. The method of forming the semiconductor structure according to claim 4, wherein a flow ratio of the trimethylsilane to the NH3 in the plasma-enhanced chemical vapor deposition process or a flow ratio of the tetramethylsilane to the NH3 in the plasma-enhanced chemical vapor deposition process is 2:1.

6. The method of forming the semiconductor structure according to claim 1, wherein a C atomic concentration in the first bonding layer distributes uniformly in the first bonding layer or increases gradually with an increasing thickness of the first bonding layer, and a C atomic concentration in the second bonding layer distributes uniformly in the second bonding layer or increases gradually with an increasing thickness of the second bonding layer.

7. The method of forming the semiconductor structure according to claim 1, wherein a thickness of the surface layer of the first bonding layer and a thickness of the surface layer of the second bonding layer range from 10 angstroms to 50 angstroms.

8. The method of forming the semiconductor structure according to claim 7, wherein the thickness of the surface layer of the first bonding layer and the thickness of the surface layer of the second bonding layer range from 20 angstroms to 50 angstroms.

9. The method of forming the semiconductor structure according to claim 7, wherein the thickness of the surface layer of the first bonding layer is equal to 30 angstroms.

10. The method of forming the semiconductor structure according to claim 9, wherein a C atomic concentration of the surface layer of the first bonding layer is higher than 40%.

11. The method of forming the semiconductor structure according to claim 1, wherein oxygen (O) is used as an oxidation gas in the oxidation treatment.

12. The method of forming the semiconductor structure according to claim 1, wherein N2 is used as a plasma source gas in the plasma treatment.

13. The method of forming the semiconductor structure according to claim 1, further including:
    forming a first bonding pad penetrating the first bonding layer;
    forming a second bonding pad penetrating the second bonding layer; and
    bonding the first bonding pad to the second bonding pad correspondingly as bonding the first bonding layer and the second bonding layer to each other.

14. The method of forming the semiconductor structure according to claim 13, wherein the first bonding pad and the second bonding pad include copper (Cu) or tungsten (W).

15. The method of forming the semiconductor structure according to claim 1, wherein a bonding strength between the second bonding layer and the first bonding layer is higher than 1.7 J/M2.

16. The method of forming the semiconductor structure according to claim 1, wherein the first bonding layer and the second bonding layer further include silicon (Si) and nitrogen (N).

17. The method of forming the semiconductor structure according to claim 1, wherein the first bonding layer and the second bonding layer are doped with at least one element of silicon (Si), nitrogen (N), oxygen (O), hydrogen (H), phosphorous (P), or fluorine (F).

18. The method of forming the semiconductor structure according to claim 1, wherein a thickness of the first bonding layer and a thickness of the second bonding layer are larger than 100 angstroms, respectively.

19. The method of forming the semiconductor structure according to claim 1, wherein the first substrate includes a first semiconductor substrate and a first device layer formed on a surface of the first semiconductor substrate, and the second substrate comprises includes a second semiconductor substrate and a second device layer formed on a surface of the second semiconductor substrate.

* * * * *